US005956292A

United States Patent [19]

Bernstein

[11] Patent Number: 5,956,292

[45] Date of Patent: Sep. 21, 1999

[54] MONOLITHIC MICROMACHINED PIEZOELECTRIC ACOUSTIC TRANSDUCER AND TRANSDUCER ARRAY AND METHOD OF MAKING SAME

[75] Inventor: Jonathan J. Bernstein, Medfield, Mass.

[73] Assignee: The Charles Stark Draper Laboratory, Inc., Cambridge, Mass.

[21] Appl. No.: 08/931,226

[22] Filed: Sep. 16, 1997

Related U.S. Application Data

[63] Continuation of application No. 08/421,618, Apr. 13, 1995, abandoned.

[51] Int. Cl.$^6$ .................... H01L 41/08

[52] U.S. Cl. .................... 367/140; 367/163; 367/174; 310/324; 310/334; 29/25.35

[58] Field of Search .................... 310/324, 334; 367/140, 174, 180, 163; 29/25.35

[56] References Cited

U.S. PATENT DOCUMENTS

| | | | |
|---|---|---|---|
| 4,841,775 | 6/1989 | Ikeda et al. | 73/704 |
| 5,075,641 | 12/1991 | Weber et al. | 331/108 C |
| 5,209,119 | 5/1993 | Polla et al. | 73/723 |
| 5,260,596 | 11/1993 | Dunn et al. | 257/414 |
| 5,406,163 | 4/1995 | Carson et al. | 310/334 |
| 5,488,954 | 2/1996 | Sleva et al. | 128/662.03 |
| 5,633,552 | 5/1997 | Lee et al. | 310/311 |

OTHER PUBLICATIONS

By Seung S. Lee et al., "Piezoelectric Cantilever Microphone and Microspeaker", Jun. 1994, pp. 33–37.

*Primary Examiner*—J. Woodrow Eldred
*Attorney, Agent, or Firm*—Iandiorio & Teska

[57] ABSTRACT

A monolithic micromechanical piezoelectric acoustic transducer with integrated control circuit includes a support member; a piezoelectric medium disposed on the support member; first and second electrodes engaging the piezoelectric medium; and a control circuit monolithically integrated with the piezoelectric medium and electrodes on the support member and including a switching circuit for selectively interconnecting the electrodes with an I/O bus and a signal processing circuit for conditioning signals propagating between the electrodes and the I/O bus; an array of such acoustic transducers that form an acoustic retina; and a method of making such transducers and arrays.

9 Claims, 6 Drawing Sheets

MONOLITHIC MICROMACHINED PIEZOELECTRIC ACOUSTIC TRANSDUCER AND TRANSDUCER ARRAY AND METHOD OF MAKING SAME

This is a continuation of application Ser. No. 08/421,618, filed Apr. 13, 1995, now abandoned.

FIELD OF INVENTION

This invention relates to a monolithic micromachined piezoelectric acoustic transducer with integrated control circuit, and more particularly and to an array of such transducers addressable over I/O buses and to a method of making such a transducer and array.

BACKGROUND OF INVENTION

To obtain an acoustic image conventionally a phased array is used. Such an approach to be done properly to obtain a two-dimensional image requires a great deal of computing power which cannot be contained in a miniature, hand-held, battery powered unit. A more direct approach would employ an array of individual acoustic transducers in conjunction with an acoustic lens, but this would be unduly complex and expensive. Each acoustic pixel or sensor, of which there would be thousands for suitable resolution, would require one or more conductors interconnecting each transducer with the associated signal processing circuits. The number of conductors could be reduced if the signals were multiplexed, but wiring thousands of transducer elements to multiplexers is itself a prohibitively costly and complex approach. The result is that there is presently available no practical implementation for an acoustic retina image sensor. Current acoustic transducers on micromachinied silicon chips (see U.S. Pat. No. 5,209,119) have low sensitivity because they are limited to thin films of PZT in the range of 0.1 to 0.5 microns. In addition, present micromachined acoustic transducers are unidirectional in that the sensing mechanism is exposed to external forces on one side only of the support substrate. This can be critical in situations where electronic circuits are added to the substrate on the front side.

SUMMARY OF INVENTION

It is therefore an object of this invention to provide an improved monolithic micromechanical piezoelectric acoustic transducer with integrated control circuit.

It is a further object of this invention to provide an array of such transducers addressable over I/O buses.

It is a further object of this invention to provide an array of such transducers which function as an acoustic retina for sensing acoustic images.

It is a further object of this invention to provide a method of making such acoustic transducers and arrays thereof.

It is a further object of this invention to provide such a transducer and transducer array which reduces the number of conductors required to read out the array.

It is a further object of this invention to provide such a transducer and transducer array which is fabricated monolithically, integrally with the associated control circuit.

It is a further object of this invention to provide such a transducer and transducer array which can sense and/or project acoustic energy from both its front and back sides.

It is a further object of this invention to provide such a transducer and transducer array which has increased acoustic sensitivity and efficiency.

The invention results from the realization that a truly effective acoustic retina for sensing two-dimensional acoustic images can be practically achieved by micromachining an acoustic transducer and an array of such transducers monolithically, integrally with their associated control circuits so that the piezoelectric medium and electrodes share the same support substrate.

This invention features a monolithic micromachined piezoelectric acoustic transducer with integrated control circuit. There is a support member and a piezoelectric medium disposed on the support member. There are first and second electrodes engaging the piezoelectric medium and a control circuit monolithically integrated with the piezoelectric medium and electrodes on the support member and including a switching circuit for selectively interconnecting the electrodes with an I/O bus and a signal processing circuit for conditioning signals propagating between the electrodes and I/O bus.

In a preferred embodiment the transducer may be a sensor or a projector of acoustic energy. The support member may include a flexible membrane for concentrating acoustic energy. The flexible member may include at least one peripheral slot for increasing its flexibility. The piezoelectric medium may be disposed proximate the flexible membrane. The first and second electrodes may be disposed on opposite sides of the piezoelectric medium. One of the electrodes may be positioned between the medium and the member. The support member may include an insulator layer on its face engaging one of the electrodes. The insulator layer may be silicon oxide or silicon nitride. The support member may include an insulator on the opposite face of the piezoelectric medium. The support member may include a membrane layer and the flexible membrane may be formed from that membrane layer. The membrane layer may be boron doped silicon. At least one of the electrodes may be made of titanium-platinum. At least one of them may be made of titanium-gold. The piezoelectric medium may be PZT. The support member may be a single silicon wafer. The flexible membrane may be disposed proximate a recess in the substrate to increase deflection of the membrane in response to incident acoustic energy. The recess may connect to the opposite side from the piezoelectric medium for enabling acoustic transduction from either side of the substrate. The flexible membrane may include first and second vanes cantilevered from the central portion containing the piezoelectric medium. The flexible membrane may include a plurality of spring regions and a plurality of piezoelectric mediums and electrodes disposed one at each of the spring regions. The piezoelectric medium may be a ferroelectric material.

The invention also features a monolithic micromachined piezoelectric acoustic transducer array including a plurality of piezoelectric acoustic transducers each including a support member; a piezoelectric medium disposed on the support member; and first and second electrodes engaging the piezoelectric medium. There is also included a control circuit monolithically integrated with the piezoelectric medium and electrodes on the support member and including a switching circuit for selectively interconnecting the electrodes with an I/O bus and a signal processing circuit for conditioning signals propagating between the electrodes and I/O bus. There is a plurality of I/O buses interconnecting the transducers.

The invention also features a transducer having a piezoelectric medium of from 1–10 microns in thickness.

The invention also features a monolithic micromachined piezoelectric acoustic sensor array including a plurality of piezoelectric acoustic sensors. Each sensor includes a support member, a piezoelectric medium disposed on the support member, first and second electrodes engaging the piezoelectric medium, and a control circuit monolithically integrated with the piezoelectric medium and electrodes on the support member and including a switching circuit for selectively interconnecting the electrodes with an I/O bus and a signal processing circuit for conditioning signals propagating between the electrodes and I/O bus. There are a plurality of I/O buses interconnecting the transducers.

The invention also features a piezoelectric acoustic sensor array in which the piezoelectric medium is from 1 to 10 microns in thickness.

The invention also features a monolithic micromachined piezoelectric transducer which includes a support member, a flexible acoustic diaphragm of boron doped silicon supported by the support member, and a piezoelectric acoustic capacitor transducer mounted on a diaphragm. The piezoelectric transducer includes first and second electrodes with a dielectric medium and piezoelectric medium between them for responding to acoustic energy incident on the diaphragm to produce a voltage across the electrodes and responding to a voltage applied to the electrodes to actuate the diaphragm to produce acoustic energy.

The invention also features a method of making a monolithic micromachined acoustic transducer including constructing a $P^+$ doped silicon membrane as an acoustic diaphragm on a support structure. A piezoelectric capacitor acoustic transducer is then constructed on the diaphragm including applying a first electrode on the diaphragm and applying a dielectric and a piezoelectric medium on the first electrode and applying a second electrode on the dielectric and piezoelectric medium, for responding to acoustic energy incident on the diaphragm to produce a voltage across the electrodes or responding to a voltage applied to the electrodes to actuate the diaphragm to produce acoustic energy.

In a preferred embodiment the diaphragm may be formed from silicon, boron doped silicon, silicon nitride, silicon carbide, polysilicon or silicon dioxide. The method may further include constructing a control circuit monolithically integrated with a piezoelectric medium and electrodes on the support member and including a switching circuit for selectively interconnecting the electrodes with an I/O bus and a signal processing circuit for conditioning signals propagating between the electrodes and I/O bus.

DISCLOSURE OF PREFERRED EMBODIMENT

Other objects, features and advantages will occur to those skilled in the art from the following description of a preferred embodiment and the accompanying drawings, in which.

Figure 1:
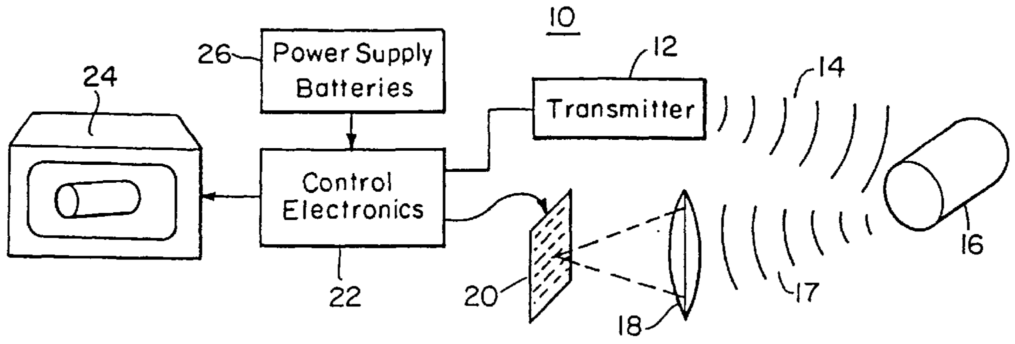
FIG. 1 is a functional block diagram of an acoustic imaging system according to this invention.

There is shown in FIG. 1 an acoustic imaging system 10 according to this invention having an acoustic transmitter 12 which emits acoustic energy shown as wavefronts 14 which strike an underwater object 16, for example, and are reflected back as wavefronts 17 where they are collected by a conventional acoustic lens 18 and directed to acoustic retina 20. Acoustic retina 20 is controlled by and delivers its accumulated signals through control electronics 22 to a visual display 24. The entire system is energized by power source 26 such as a battery pack. The entire acoustic imaging system 10 may be contained in the hand-held camera or device which may be moved about underwater to produce a visual display of the acoustically sensed environment, or may for example be miniaturized and enclosed in a pair of goggles similar to night vision goggles.

Figure 2:
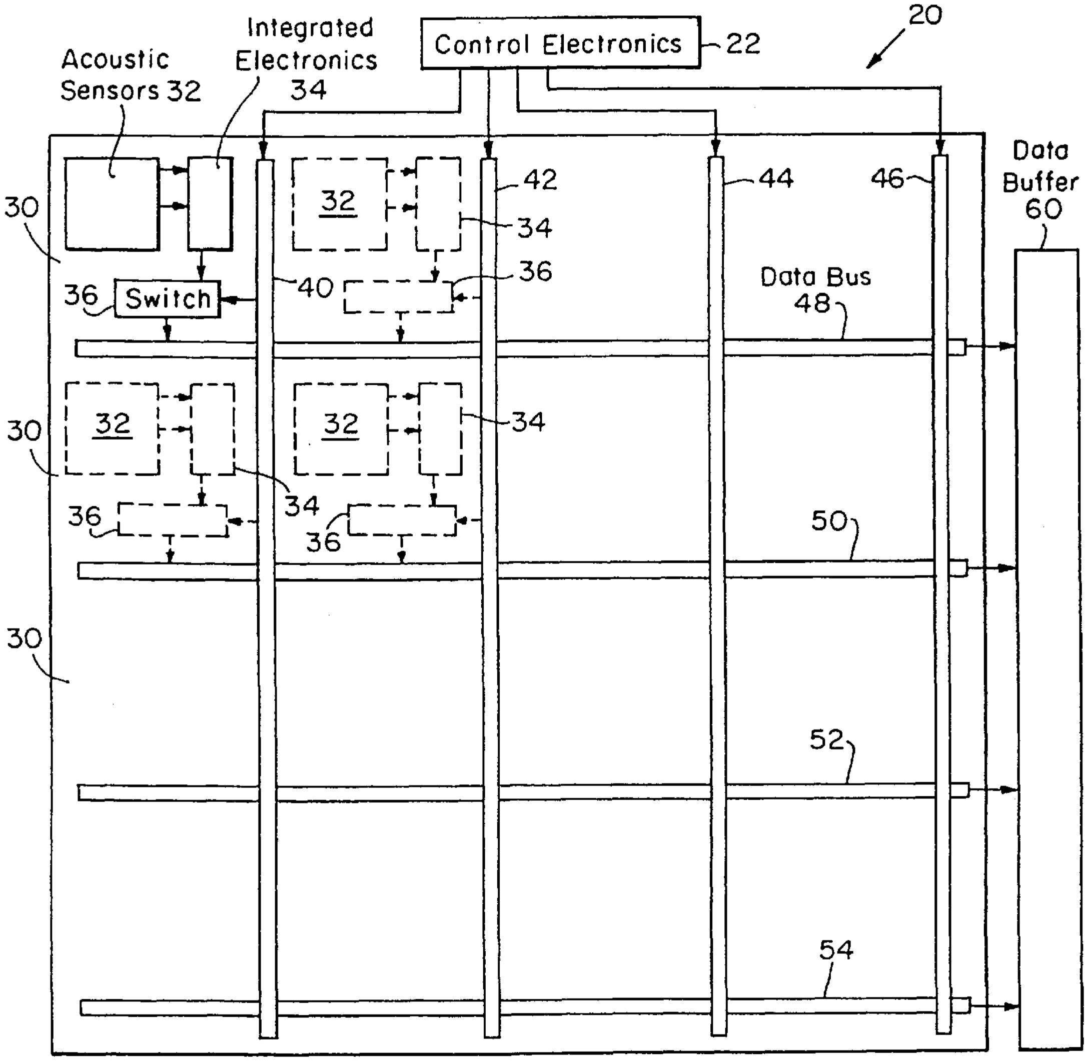
FIG. 2 is an enlarged detailed schematic of the acoustic retina of FIG. 1 including a monolithic micromachined piezoelectric acoustic sensor array.

Acoustic retina 20, FIG. 2, may include a plurality of acoustic pixels 30 each of which contains an acoustic sensor 32, integrated electronics 34, and a switching device 36. Integrated electronics 34 perform amplification and signal processing of the signal received from acoustic sensors 32 for delivery to switch 36. Control electronics 22 operates each of switches 36 via column-select lines 40, 42, 44 and 46 to place the information sensed by each of the acoustic sensors 32 onto selected ones of data buses 48, 50, 52 and 54. In this way the acoustic energy stimulating each of the pixels 30 of acoustic retina 20 can be read out and captured in data buffer 60 for subsequent creation of a visual image display.

Figure 3:
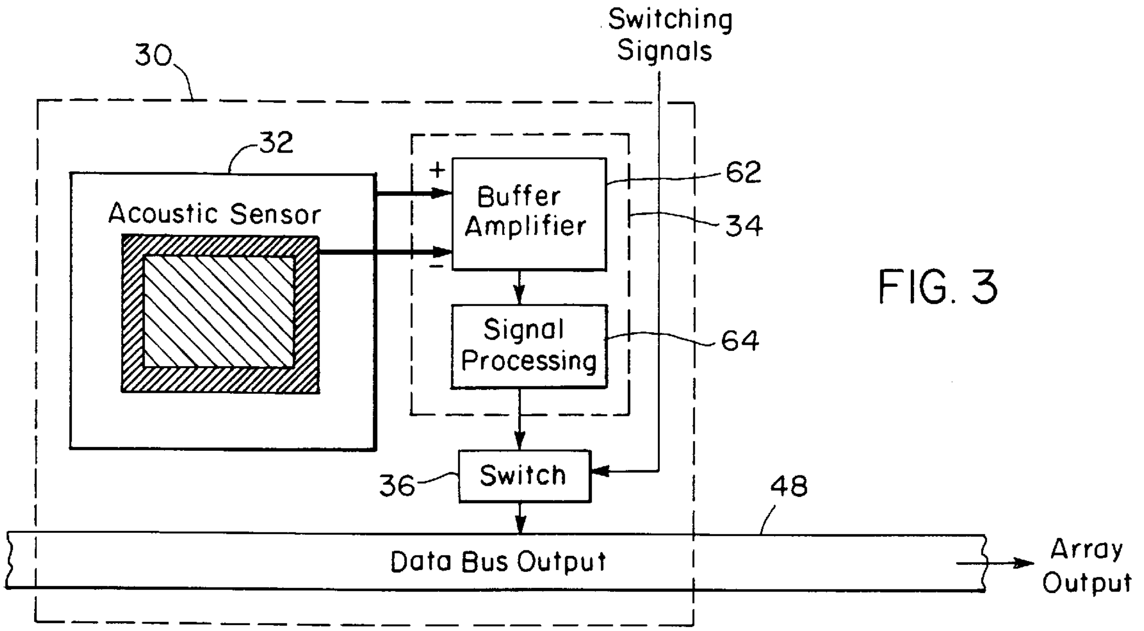
FIG. 3 is a schematic diagram of one of the transducers making up the array of FIG. 2.

A single acoustic pixel 30 is shown in FIG. 3, where the output from acoustic sensor 32 is shown delivered first to buffer amplifier 62 and integrated electronics 34 and then to signal processing circuit 64, after which it is delivered to switch 36. The entire construction of the acoustic sensor 32, integrated electronics 34 and switch 36 is fabricated by micromachining as a single monolithic integrated unit on the same wafer. Further, all of the pixel cells 30, FIG. 3, as shown in the acoustic retina 20 of FIG. 2, may be fabricated on a single wafer so that the entire array including all of the pixels 30 and all of the column-select lines 40–46 as well as the data buses 48–54 are similarly fabricated as a single monolithic micromachined integrated unit.

Figure 4:
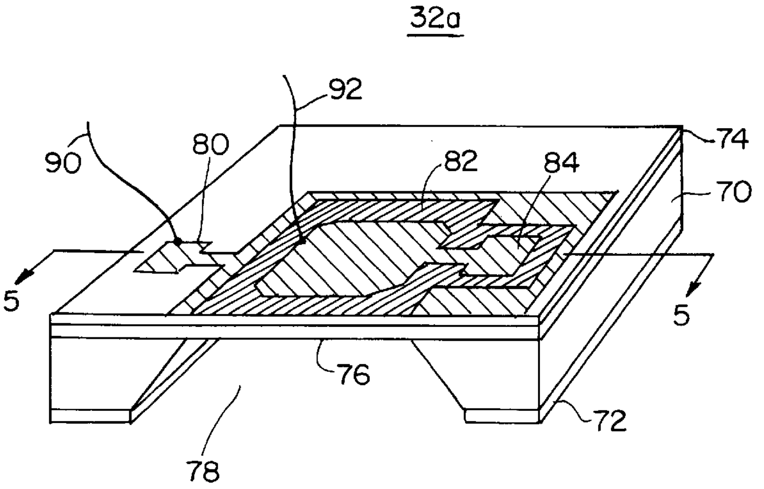
FIG. 4 is a three-dimensional schematic diagram of a micromachined acoustic transducer according to this invention.
Figure 5:
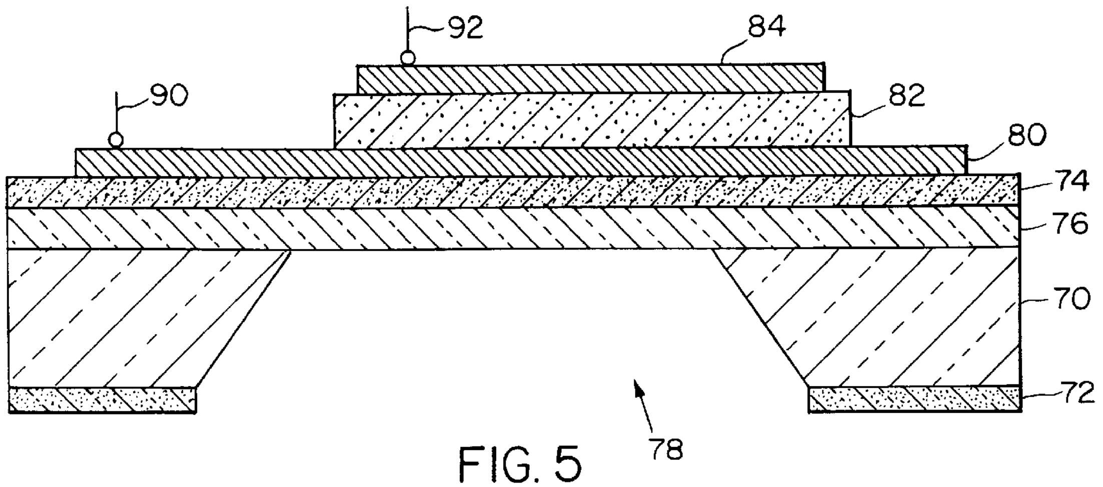
FIG. 5 is a cross-sectional view taken along line 5—5 of FIG. 4.

Sensor 32 may take a number of forms. For example, acoustic sensor 32*a*, FIG. 4, includes a silicon wafer 70 having a lower 72 and upper 74 insulating layer such as, for example, silicon dioxide or silicon nitride. Between insulating layer 74 and substrate 70, as can be more clearly seen with respect to FIG. 5, there is a diaphragm or membrane layer 76 which can be made of, for example, boron doped silicon. Diaphragm membrane 76 can also be made of: silicon, silicon nitride, silicon carbide, polysilicon or silicon dioxide, for example. Substrate 70 as well as insulating layer 72 may be etched through to create back-side cavity 78 to further expose and enhance the flexibility of the membrane mounted on substrate 70. Further, this allows the acoustic energy to be sensed and/or projected from either side. Proximate membrane 76 in the area of back-side cavity 78 is lower electrode 80 which may be made of titanium-platinum for example and on which is located piezoelectric film 82. This piezoelectric film 82 may be a piezoelectric material such as zinc oxide, aluminum nitride, quartz, gallium arsenide, lithium niobate, or a ferroelectric material such as PZT, PMN, barium titanate, or strontium titanate. Piezoelectric film 82 is preferably 1 to 10 microns in thickness as compared to prior devices which employ films only 0.1 to 0.5 microns thick. This thicker piezoelectric film gives higher acoustic sensitivity and improved transduction efficiency. On top of piezoelectric film 82 is top electrode 84 which may be made, for example, out of titanium-gold. When acoustic energy is applied to stress piezoelectric layer 82, a voltage is created which is sensed through electrodes 80 and 84. That voltage appears across leads 90, 92, FIG. 5, when functioning as a sensor. Conversely, when functioning as a projector a voltage is applied through leads 90 and 92 to stress piezoelectric layer 82 and create an acoustic wave. Acoustic sensor 32*a*, FIG. 4, may be operated as an acoustic emitter or projector simply by applying a driving voltage to it through electrodes 80, 84. Throughout this specification and the claims the term piezoelectric is used in its broad sense to include ferroelectric materials and electrostrictive materials as well as specific piezoelectric materials: that is, any material which responds to an applied electric field to change shape or responds to stress to produce an electrical charge.

Figure 6:
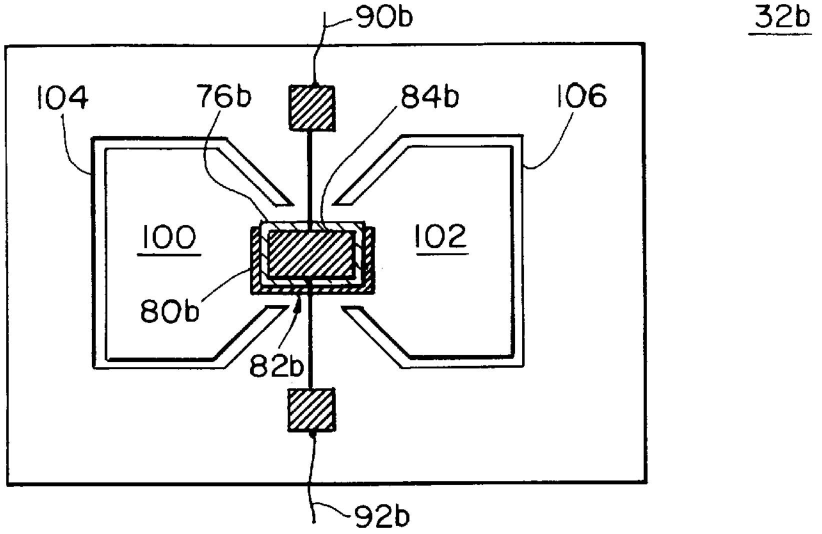
FIG. 6 is a top plan diagrammatic view of an alternative form of acoustic transducer according to this invention.
Figure 7:
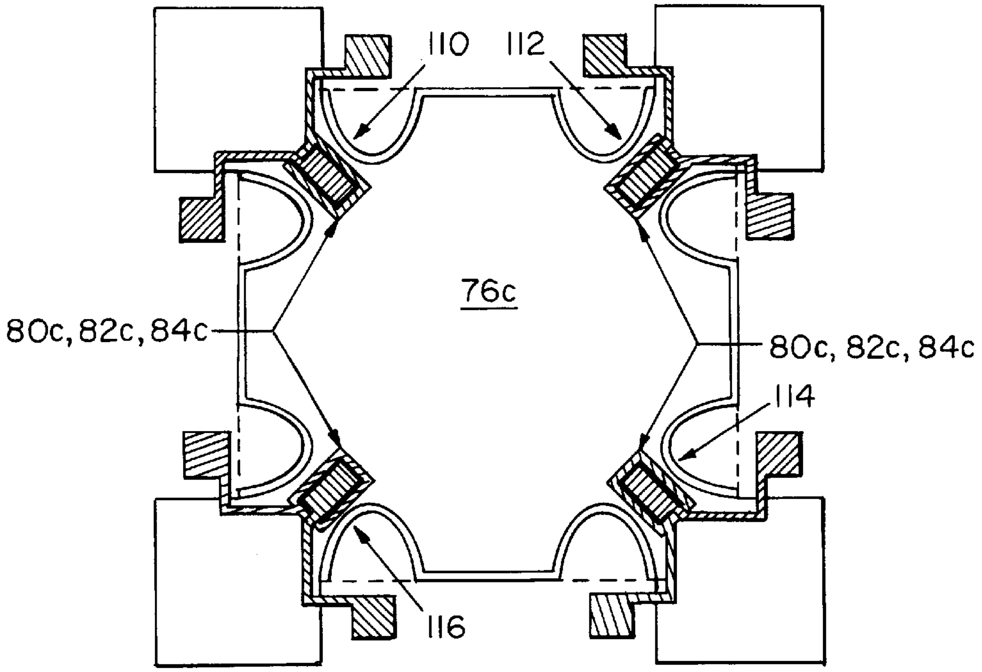
FIG. 7 is a top plan diagrammatic view of another alternative form of an acoustic transducer according to this invention.

In an alternative construction acoustic transducer 32*b*, FIG. 6, may be made so that piezoelectric layer 82*b* and electrodes 80*b* and 84*b* reside in the center portion between two vanes or wings 100, 102 defined by cutouts or slots 104, 106, respectively, in order to mechanically amplify the effect of the acoustic energy received by sensor 32*b*. In another construction acoustic sensor 32*c*, FIG. 7, may include an enlarged flexible membrane 76*c* which has four narrowed spring regions 110, 112, 114 and 116, each of which is provided with piezoelectric layer 82*c* between electrodes 80*c* and 84*c*.

Figure 8:
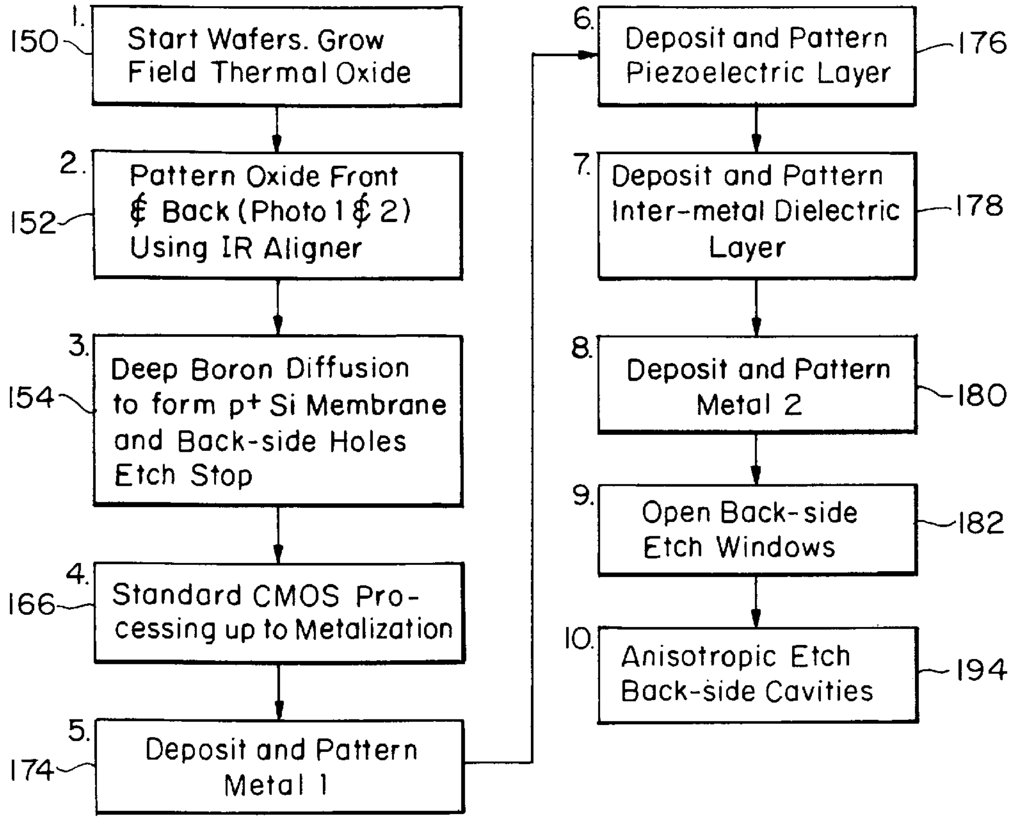
FIG. 8 is a block diagram of a fabrication process according to the method of this invention for a piezoelectric hydrophone using $P^{++}$ membrane and back side cavities.
Figure 9:
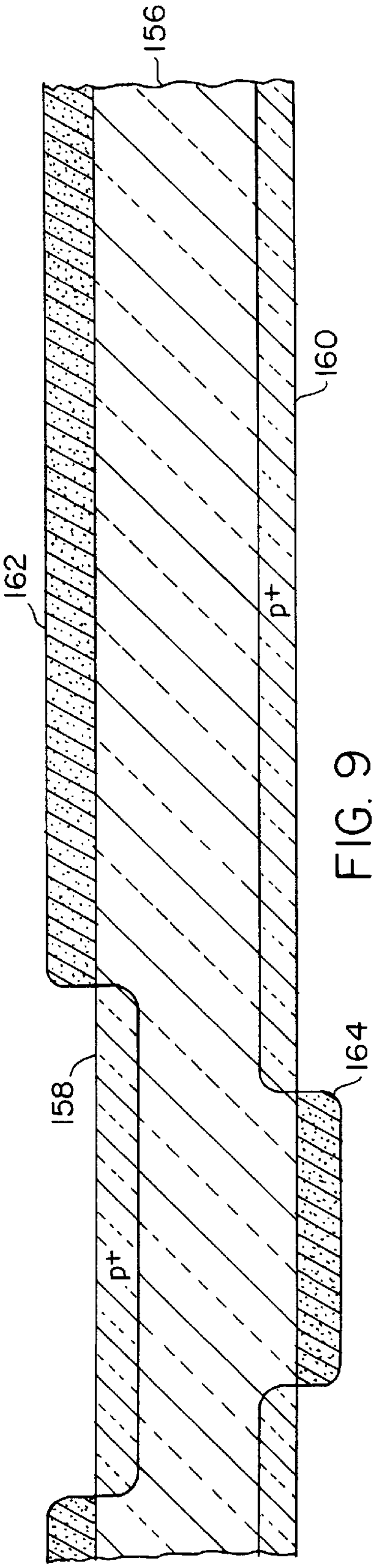
FIG. 9 is a schematic sectional view of the wafer or substrate with $P^+$ diffusions to define etch-stop membrane and back-side holes in accordance with the method of FIG. 8.

The method for fabricating a piezoelectric hydrophone using $P^{++}$ membrane and back-side cavities according to this invention begins with growing a field thermal oxide layer on a wafer, step 150, FIG. 8. After that in step 152 the oxide is patterned on the front and back and two photolithographic steps are employed. Each of the photolithographic steps includes depositing a photoresist and exposing it to ultraviolet light through a mask in order to obtain the desired pattern. An infrared aligner is used to align the front and back masks on the wafer. Following this, in step 154 deep boron diffusion is accomplished to form the $P^+$ silicon membrane and back-side hole etch stops. At this point the wafer 156, FIG. 9, contains $P^+$ silicon diffusion 158 on the top and 160 on the bottom with remaining field oxide layers 162 on the top and 164 on the bottom. $P^+$ silicon diffusion 158 is the area in which the transducer will be constructed. The area of field oxide 162 is the area where the MOSFETs will be constructed.

Figure 10:
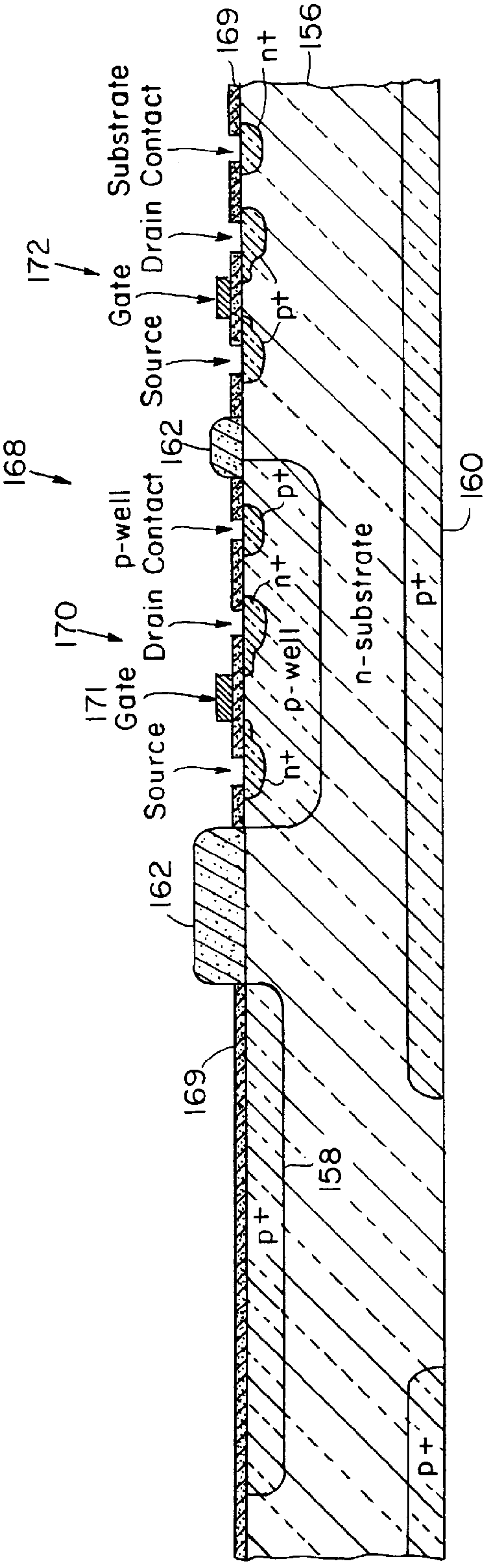
FIG. 10 is a schematic sectional view of the wafer or substrate with $P^+$ diffusions and CMOS circuitry to define etch-stop membrane and back-side holes in accordance with the method of FIG. 8.
Figure 11:
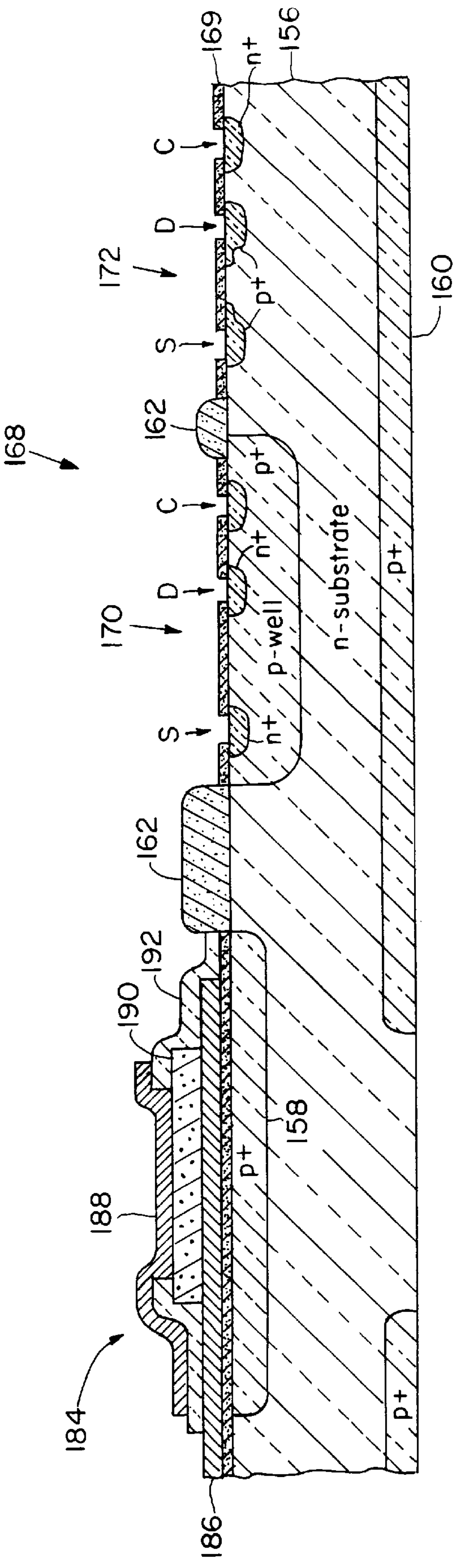
FIG. 11 is a schematic sectional view of the wafer or substrate with piezoelectric transducer and CMOS circuitry before an anisotropic etch to define the etch-stop membrane and back-side holes in accordance with the method of FIG. 8.
Figure 12:
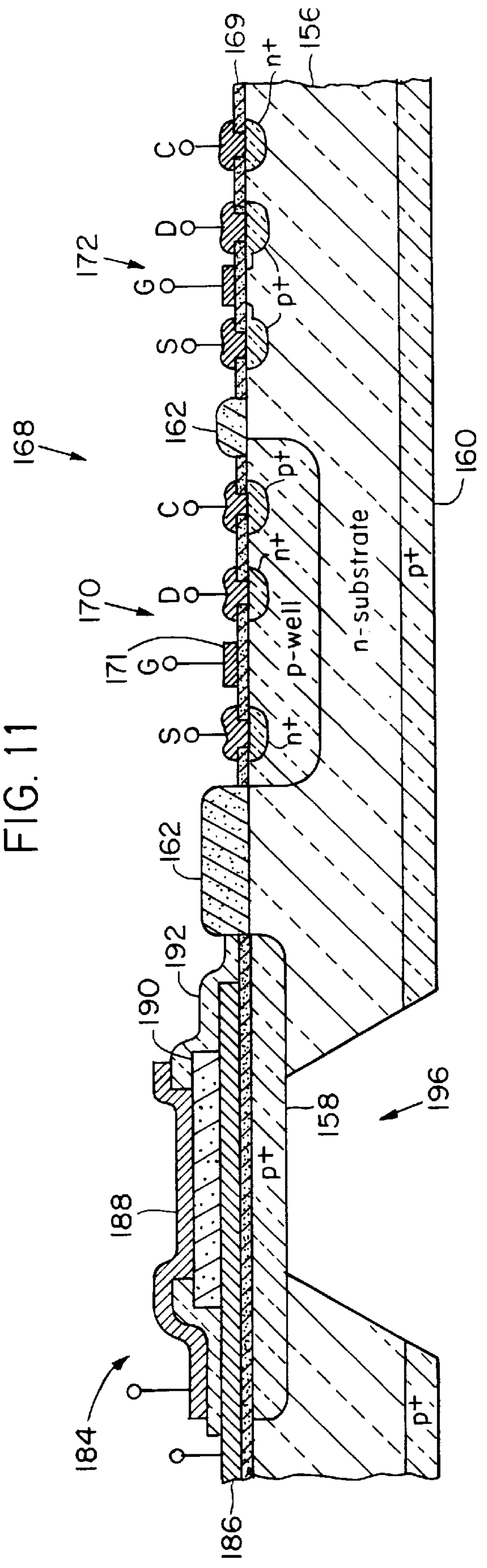
FIG. 12 is a schematic sectional view of the wafer or substrate showing the completed micromachined acoustic sensor with integrated CMOS electronic circuit elements to define the etch-stop membrane and back-side holes in accordance with the method of FIG. 8.

In step 166, FIG. 8, standard CMOS processing is executed up to the metalization process so that the wafer now appears as shown in FIG. 10, where the field oxide 164 has been removed and the CMOS electronics 168 including N channel MOSFET 170 and P channel MOSFET 172 have been constructed in the area of field oxide 162. The CMOS process and the deep boron diffusion process may be combined to improve the thermal efficiency of the overall process. CMOS electronics 168 includes, among other things, oxide layer 169 and gate region 171. Following this in step 174, FIG. 8, the first metal layer is deposited and patterned, after which in step 176 the piezoelectric layer is deposited and patterned. The intermetal dielectric layer is deposited and patterned in step 178. Then the second metal layer is deposited and patterned, step 180, and the back-side windows are etched in step 182. The wafer now appears as shown in FIG. 11. The transducer 184 is now constructed including lower metal electrode 186, upper metal electrode 188, piezoelectric layer 190, and the dielectric layer 192. Finally, in step 194, FIG. 8, the anisotropic etch is performed on the back-side cavities to form back-side hole 196, visible in FIG. 12.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A monolithic micromechanical piezoelectric acoustic transducer with integrated control circuit, comprising:

a support member, wherein said support member includes a flexible membrane for concentrating acoustic energy and wherein said flexible membrane includes at least one peripheral slot for increasing its flexibility;

a piezoelectric medium disposed on said support member;

first and second electrodes engaging said piezoelectric medium; and a control circuit monolithically integrated with said piezoelectric medium and electrodes on said support member and including a switching circuit for selectively interconnecting said electrodes with an I/O bus and a signal processing circuit for conditioning signals propagating between said electrodes and I/O bus.

2. A monolithic micromechanical piezoelectric acoustic transducer with integrated control circuit, comprising:

a support member;

a piezoelectric medium disposed on said support member;

first and second electrodes engaging said piezoelectric medium;

a control circuit monolithically integrated with said piezoelectric medium and electrodes on said support member and including a switching circuit for selectively interconnecting said electrodes with an I/O bus and a signal processing circuit for conditioning signals propagating between said electrodes and I/O bus; and wherein said support member includes an insulator layer and a backside cavity on the opposite face from said piezoelectric medium to allow sensing of acoustic energy from either side of the transducer.

3. A monolithic micromechanical piezoelectric acoustic transducer with integrated control circuit, comprising:

a support member;

a piezoelectric medium disposed on said support member;

first and second electrodes engaging said piezoelectric medium;

a control circuit monolithically integrated with said piezoelectric medium and electrodes on said support member and including a switching circuit for selectively interconnecting said electrodes with an I/O bus and a signal processing circuit for conditioning signals propagating between said electrodes and I/O bus; and wherein said support member includes a flexible membrane for concentrating acoustic energy, in which said flexible membrane includes first and second vanes cantilevered from a central portion containing said piezoelectric medium.

4. A monolithic micromechanical piezoelectric acoustic transducer with integrated control circuit, comprising:

a support member;

a piezoelectric medium disposed on said support member;

first and second electrodes engaging said piezoelectric medium;

a control circuit monolithically integrated with said piezoelectric medium and electrodes on said support member and including a switching circuit for selectively interconnecting said electrodes with an I/O bus and a signal processing circuit for conditioning signals propagating between said electrodes and I/O bus; and wherein said support member includes a flexible membrane for concentrating acoustic energy, in which said flexible membrane includes a plurality of spring regions and a plurality of piezoelectric membranes and electrodes disposed one at each of said spring regions.

5. The monolithic micromechanical piezoelectric acoustic transducer with integrated control circuit of claim 1 wherein said support member includes a backside cavity on the opposite face from said piezoelectric medium to allow sensing of acoustic energy from either side of the transducer.

6. The monolithic micromechanical piezoelectric acoustic transducer with integrated control circuit of claim 3 wherein said support member includes a backside cavity on the opposite face from said piezoelectric medium to allow sensing of acoustic energy from either side of the transducer.

7. The monolithic micromechanical piezoelectric acoustic transducer with integrated control circuit of claim 4 wherein said support member includes a backside cavity on the opposite face from said piezoelectric medium to allow sensing of acoustic energy from either side of the transducer.

8. The monolithic micromechanical piezoelectriz acoustic transducer with integrated control circuit of claim 1 in which said flexible membrane includes first and second vanes cantilevered from a central portion containing said piezoelectric medium.

9. The monolithic micromechanical piezoelectric acoustic transducer with integrated control circuit of claim 1 in which said flexible membrane includes a plurality of spring regions and a plurality of piezoelectric membranes and electrodes disposed one at each of said spring regions.

* * * * *